(12) United States Patent
Higo et al.

(10) Patent No.: US 8,547,731 B2
(45) Date of Patent: Oct. 1, 2013

(54) MEMORY DEVICE HAVING A MAGNETIC LAYER WITH A PERPENDICULAR DIRECTION OF MAGNETIZATION RELATIVE TO A DIRECTION OF MAGNETIZATION OF A FIXED MAGNETIZATION LAYER

(75) Inventors: Yutaka Higo, Kanagawa (JP); Masanori Hosomi, Tokyo (JP); Hiroyuki Ohmori, Kanagawa (JP); Kazuhiro Bessho, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 204 days.

(21) Appl. No.: 13/098,996

(22) Filed: May 2, 2011

(65) Prior Publication Data

US 2011/0305077 A1    Dec. 15, 2011

(30) Foreign Application Priority Data

Jun. 15, 2010    (JP) ................. 2010-136163

(51) Int. Cl.
    *G11C 11/00*      (2006.01)
    *G11C 11/15*      (2006.01)
    *H01L 29/82*      (2006.01)

(52) U.S. Cl.
    USPC ............... 365/158; 365/173; 257/421

(58) Field of Classification Search
    USPC ...................................... 365/158
    See application file for complete search history.

(56) References Cited

U.S. PATENT DOCUMENTS

| | | | |
|---|---|---|---|
| 5,695,864 A | 12/1997 | Slonczewski | |
| 6,532,164 B2 * | 3/2003 | Redon et al. | 365/97 |
| 7,307,876 B2 * | 12/2007 | Kent et al. | 365/171 |
| 7,633,796 B2 * | 12/2009 | Yamane et al. | 365/171 |
| 7,714,399 B2 * | 5/2010 | Morise et al. | 257/421 |
| 7,768,824 B2 * | 8/2010 | Yoshikawa et al. | 365/173 |
| 7,936,592 B2 * | 5/2011 | Wang et al. | 365/158 |
| 7,957,181 B2 * | 6/2011 | Nozieres et al. | 365/171 |
| 8,102,700 B2 * | 1/2012 | Liu et al. | 365/158 |
| 8,102,703 B2 * | 1/2012 | Nozieres et al. | 365/173 |
| 2011/0013448 A1 * | 1/2011 | Nozieres et al. | 365/173 |
| 2012/0257448 A1 * | 10/2012 | Ong | 365/171 |

FOREIGN PATENT DOCUMENTS

JP      2003-17782      1/2003

* cited by examiner

*Primary Examiner* — Son Mai
(74) *Attorney, Agent, or Firm* — Dentons US LLP

(57) ABSTRACT

Disclosed herein is a memory device, including: a memory element including a memory layer for holding therein information in accordance with a magnetization state of a magnetic material, a fixed magnetization layer which is provided on the memory layer through a non-magnetic layer and whose direction of a magnetization is fixed to a direction parallel with a film surface, and a magnetic layer which is provided on a side opposite to the fixed magnetization layer relative to the memory layer through a non-magnetic layer and whose direction of a magnetization is a direction vertical to the film surface; and a wiring through which a current is caused to flow through the memory element in a direction of lamination of the layers of the memory element.

5 Claims, 2 Drawing Sheets

MEMORY DEVICE HAVING A MAGNETIC LAYER WITH A PERPENDICULAR DIRECTION OF MAGNETIZATION RELATIVE TO A DIRECTION OF MAGNETIZATION OF A FIXED MAGNETIZATION LAYER

BACKGROUND

The present disclosure relates to a memory device in which information is recorded in a memory element based on spin torque magnetization reversal.

Along with the great strides of various information apparatuses from a mobile terminal to a large-capacity server, further high performance such as highly increased integration, speed-up, or low power consumption promotion is sought in elements such as a memory and a logical element composing these information apparatuses.

In particular, the progress of semiconductor nonvolatile memories is remarkable, and flash memories as large-capacity file memories become popular as if the flash memories drive out hard disc drives.

On the other hand, the semiconductor nonvolatile memories are being advanced while the development to a code storages and further working memories is anticipated in order to replace NOR (Not OR) flash memories, DRAMs (Dynamic Random Access Memory) and the like which are generally used at the present time with the semiconductor nonvolatile memories. For example, a Ferroelectric Random Access Memory (FeRAM), a Magnetic Random Access Memory (MRAM), a Phase-Change RAM (PCRAM), and the like are given as the semiconductor nonvolatile memories. A part of them has already been put into practical use.

High-speed rewrite and approximately infinite ($10^{15}$ times or more) rewrite are possible in the MRAM of these nonvolatile memories because data is stored in the MRAM based on a magnetization direction of a magnetic material. Thus, the MRAMs have already been used in the field of an industrial automation, aircrafts, and the like.

Since the MRAM has a high-speed operation and high reliability, in future, the development of the MRAM to the code storage and the working memory is expected.

However, the MRAM involves a problem in the low power consumption promotion and the large capacity promotion.

This is an essential problem due to the recording principles of the MRAM, that is, a system that a magnetization is reversed by a current magnetic field generated from a wiring.

A recording (that is, magnetization reversal) system not relying on the current magnetic field is studied as one of methods for solving this problem. In particular, the research about spin torque magnetization reversal is actively carried out. The research concerned, for example, is described in U.S. Pat. No. 5,695,864 and Japanese Patent Laid-Open No. 2003-17782.

A memory element utilizing the spin torque magnetization reversal is composed of a Magnetic Tunnel Junction (MTJ) similarly to the case of the MRAM.

Also, in the spin torque magnetization reversal-based memory element, when a spin polarized electron passed through a magnetic layer fixed in a certain direction is intended to enter another free magnetic layer (not fixed in direction thereof), a torque is imposed to the another free magnetic layer. In this case, when a current whose value is equal to or larger than a certain threshold value is caused to flow through the memory element, a direction of the magnetization of the free magnetic layer is reversed.

A polarity of the current caused to flow through the memory element is changed, thereby carrying out rewrite of "0" or "1."

An absolute value of the current for reversal of the magnetization of the free magnetic layer is equal to or smaller than 1 mA in the case of the memory element which is about 0.1 µm in scale. In addition, the scaling is possible because the current value is reduced in proportion to a volume of the memory element.

In addition thereto, there is also obtained an advantage that a cell configuration becomes simple because a word line for generation of a recording current magnetic field which has been necessary for the MRAM in the past is unnecessary.

Hereinafter, the MRAM utilizing the spin torque magnetization reversal will be referred to as the "Spin Torque-Magnetic Random Access Memory (ST-MRAM)."

Large expectation is placed on the ST-MRAM as the nonvolatile memory which makes the low power consumption and the large capacity promotion possible while the advantages of the MRAM that the high speed operation is carried out and the number of times of rewrite is approximately infinite are held.

SUMMARY

In the ST-MRAM, the spin torque which causes the magnetization reversal is changed in magnitude thereof depending on the direction of the magnetization.

In the structure of the normal memory element of the ST-MRAM, a magnetization angle exists at which the spin torque becomes zero.

When the magnetization angle in an initial state agrees with that magnetization angle, a period of time necessary for the magnetization reversal becomes very long. For this reason, the case where the magnetization reversal is not completed within a period of time for write may be caused.

When the magnetization reversal is not completed within the period of time for the write, the write operation fails to be carried out (write error), and thus it may be impossible to carry out the normal write operation.

The present disclosure has been made in order to solve the problems described above, and it is therefore desirable to provide a memory device in which a write operation can be carried out for a short period of time without generating any of errors.

In order to attain the desire described above, according to an embodiment of the present disclosure, there is provided a memory device including: a memory element including a memory layer for holding therein information in accordance with a magnetization state of a magnetic material, a fixed magnetization layer which is provided on the memory layer through a non-magnetic layer and whose direction of a magnetization is fixed to a direction parallel with a film surface, and a magnetic layer which is provided on a side opposite to the fixed magnetization layer relative to the memory layer through a non-magnetic layer and whose direction of a magnetization is a direction vertical to the film surface; and a wiring through which a current is caused to flow through the memory element in a direction of lamination of the layers of the memory element.

In the structure of the memory device according to the embodiment of the present disclosure, the magnetic layer whose direction of the magnetization is vertical to the film surface is provided on the side opposite to the fixed magnetization layer whose direction of the magnetization is fixed to the direction parallel with the film surface relative to the memory layer through the non-magnetic layer.

Since the direction of the magnetization of the memory layer is approximately parallel with the film surface, a relative angle between the direction of the magnetization of the magnetic layer whose direction of the magnetization is vertical to the film surface, and the direction of the magnetization of the memory layer whose direction of the magnetization is approximately parallel with the film surface is approximately 90°.

As a result, it is possible to suppress the divergence, of the period of time necessary for the magnetization reversal, due to that the directions of the magnetizations of the memory layer and the fixed magnetization layer become approximately either parallel or antiparallel. Therefore, the direction of the magnetization of the memory layer can be reversed within a predetermined finite period of time, thereby writing the information to the memory element.

As set forth hereinabove, according to the present disclosure, since the direction of the magnetization of the memory layer can be reversed within the predetermined period of time, thereby writing the information to the memory element, the write error can be reduced, and the write operation can be carried out for a shorter period of time.

Since the write error can be reduced, the reliability of the write operation can be enhanced.

Since the write operation can be carried out for the shorter period of time, the speed-up of the operation can be realized.

Therefore, according to the present disclosure, it is possible to realize the memory device which has the high reliability in write operation and which operates at the high speed.

DETAILED DESCRIPTION OF THE PREFERRED EMBODIMENT

Embodiment of the present disclosure will be described in detail hereinafter with reference to the accompanying drawings.

It is noted that the description will be given below in accordance with the following order.
1. Outline of the Disclosure
2. Embodiment
1. Outline of the Disclosure Firstly, the outline of the present disclosure will be described prior to a description of a concrete embodiment of the present disclosure.

Figure 4:
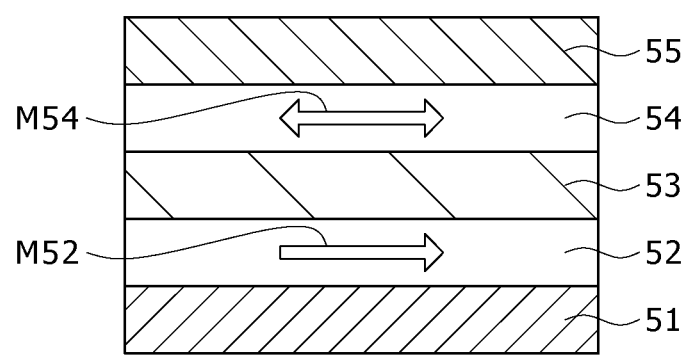
FIG. 4 is a cross sectional view showing a schematic structure of an ST-MRAM which has been proposed up to this time.

FIG. 4 is a cross sectional view showing a schematic structure of an ST-MRAM which has been proposed up to this time.

As shown in FIG. 4, a fixed magnetization layer (called a reference layer as well) 52 whose direction of a magnetization M52 is fixed, a non-magnetic layer (intermediate layer) 53, a free magnetization layer (memory layer) 54 whose direction of a magnetization M54 is adapted to be reversed, and a cap layer 55 are laminated in this order on a base layer 51, thereby composing a memory element.

Of the fixed magnetization layer 52, the non-magnetic layer 53, the free magnetization layer 54, and the cap layer 55, in the fixed magnetization layer 52, the direction of the magnetization M52 is fixed by a high magnetic coercive force or the like.

In the ST-MRAM (memory element) shown in FIG. 4, information is stored in accordance with the direction of the magnetization (magnetic moment) M54 of the memory layer 54 having uniaxial anisotropy.

A current is caused to flow in a direction vertical to a film surface of each of the layers of the memory element (that is, a direction of lamination of the layers) to cause spin torque magnetization reversal in the free magnetization layer serving as the memory layer 54, thereby writing information to the memory element.

Here, the spin torque magnetization reversal will be described in brief.

An electron has two kinds of spin angular moments. The two kinds of spin angular moments are tentatively defined as an upward spin angular moment and a downward spin angular moment, respectively.

The number of electrons each having the upward spin angular moment, and the number of electrons each having the downward spin angular moment are identical to each other in the inside of a non-magnetic material. On the other hand, there is a difference between the number of electrons each having the upward spin angular moment, and the number of electrons each having the downward spin angular moment in the inside of a ferromagnetic material.

Firstly, let us consider the case where in the two layers of the ferromagnetic materials: the fixed magnetization layer 52; and the free magnetization layer 54 which are laminated through the non-magnetic layer (intermediate later) 53, the respective directions of the magnetizations M52 and M54 are held in an antiparallel state, and the electrons are moved from the fixed magnetization layer 52 to the free magnetization layer (memory layer) 54.

The spin polarization, that is, a difference between the number of electrons each having the upward spin angular moment, and the number of electrons each having the downward spin angular moment is generated in the electrons which have been passed through the fixed magnetization layer 52.

When a thickness of the non-magnetic layer 53 is sufficient small, before the spin polarization is relaxed to set the electrons in a non-polarization (the number of electrons each having the upward spin angular moment, and the number of electrons each having the downward spin angular moment are identical to each other) state in the normal non-magnetic material, the electrons reach the other magnetic material, that is, the free magnetization layer (memory layer) 54.

Also, since the degrees of the spin polarizations in the two layers of the ferromagnetic materials: the fixed magnetization layer 52; and the free magnetization layer 54 are opposite in sign to each other, a part of the electrons is reversed, that is, the direction of the spin angular momenta thereof is changed in order to reduce an energy of a system. At this time, since it is necessary to preserve the entire angular momenta of the system, a reaction equivalent to the sum of changes of the angular momenta by the electrons whose directions of the spin angular momenta are changed is imposed on the magnetization M54 as well of the free magnetization layer (memory layer) 54.

When an amount of current, that is, the number of electrons which have passed through the fixed magnetization layer 52 per unit time is small, the total sum of the electrons whose directions of the spin angular momenta have been changed is also small. Therefore, a change in angular momentum generated in the magnetization M54 of the free magnetization layer (memory layer) 54 is also small. However, when the current is increased, a large change in angular momentum can be imposed on the magnetization M54 of the free magnetization layer 54 within a unit time.

A change in angular momentum is expressed in the form of a torque. When the torque exceeds a certain threshold value, the magnetization M54 of the free magnetization layer (memory layer) 54 starts a precessional moment and is stabilized when the magnetization M54 of the free magnetization layer 54 rotates by 180° due to the uniaxial anisotropy of the free magnetization layer (memory layer) 54. That is to say, the reversal from the antiparallel state to the parallel state is caused.

On the other hand, when the magnetizations M52 and M54 of the two layers of the ferromagnetic materials 52 and 54 are held in the parallel state, the current is caused to reversely flow in a direction in which the electrons are sent from the free magnetization layer (memory layer) 54 to the fixed magnetization layer 52, which results in that the electrons are reflected by the fixed magnetization layer 52 this time.

Also, the torque is imposed on the magnetization M54 of the free magnetization layer 54 when the electrons which have been reflected by the fixed magnetization layer 52 to reverse the directions of the spins thereof enter the free magnetization layer 54, thereby reversing the direction of the magnetization M54 of the free magnetization layer (memory layer) 54. As a result, the magnetizations M52 and M54 of the ferromagnetic materials 52 and 54 can be reversed to the antiparallel state.

However, at this time, an amount of current necessary for causing the reversal is more than that of current necessary for the reversal of the magnetization from the antiparallel state to the parallel state.

Although it is difficult to intuitively understand the reversal of the magnetization from the parallel state to the antiparallel state, the reversal of the magnetization from the parallel state to the antiparallel state may also be understood in such a way that it may be impossible to carry out the reversal of the magnetization because the magnetization M52 of the fixed magnetization layer 52 is fixed, and the direction of the magnetization M54 of the free magnetization layer 54 is reversed in order to preserve an angular momenta of the entire system.

As described above, the current whose value is equal to or larger than the certain threshold value and which corresponds to the polarity of the current caused to flow through the memory element is caused to flow in the direction from the fixed magnetization layer (reference layer) 52 to the free magnetization layer (memory layer) 54 or in the direction opposite thereto, thereby recording the information of "0" or "1" in the memory element.

An operation for reading out information is carried out by using a magnetoresistance effect similarly to the case of the existing MRAM.

That is to say, similarly to the case of the operation for recording the information as described above, the current is caused to flow in the direction vertical to the film surface of each of the layers. Also, a phenomenon is utilized that an electric resistance shown by the memory element is changed in accordance with whether the direction of the magnetization M54 of the free magnetization layer (memory layer) 54 is parallel or antiparallel with the direction of the magnetization M52 of the fixed magnetization layer (reference layer) 52.

Now, a material used in the non-magnetic layer (intermediate layer) 53 may be either a metal or an insulator. However, when the insulator is used in the non-magnetic layer 53, a higher read signal (a change rate of a resistance) is obtained and thus the information can be recorded in the memory element by using the lower current. An element at this time is referred to as a Magnetic Tunnel Junction (MTJ) element.

The spin torque described above is changed in magnitude thereof in accordance with an angle between the magnetization M54 of the free magnetization layer (recording layer) 54 and the magnetization M52 of the fixed magnetization layer (surface layer) 52.

When let m1 to be a unit vector representing the direction of the magnetization M54, and let m2 to be a unit vector representing the direction of the magnetization M52, the magnitude of the spin torque is proportional to m1×(m1×m2) where a mark "x" represents a cross product of vectors.

Normally, the magnetization M52 of the fixed magnetization layer 52 is fixed to a direction of an axis of an easy magnetization of the memory layer 54. The magnetization M54 of the memory layer 54 has a tendency to be tiled in the direction of the axis of the easy magnetization of the memory layer 54 itself. At this time, the unit vectors m1 and m2 make an angle of either 0° or 180°. To this end, according to the above expression of the spin torque, the spin torque does not function at all.

Actually, the magnetization M54 of the memory layer 54 distributes at random around the axis of the easy magnetization due to thermal perturbation. Therefore, when the angle between the magnetization M52 of the fixed magnetization layer 52, and the magnetization M54 of the memory layer 54 is out of either 0° or 180°, the spin torque functions, thereby making it possible to cause the magnetization reversal.

A period, ts, of time necessary for the magnetization reversal can be expressed by Expression (1):

$$ts = \tau ln(\Pi/2\theta)/(I/Ic0-1) \qquad (1)$$

where θ is an angle between unit vectors m1 and m2, τ is a time parameter determined from a material or the like of the memory layer 54 and is normally several nanoseconds, I is a current caused to flow through an MTJ, and Ic0 is a current necessary for starting a precessional motion.

As can be seen from Expression (1), as θ becomes close to zero, ts diverges to infinity.

Now, it is assumed that τ=1 ns, I/Ic0=1.2, and a write period of time is 20 ns. At this time, when θ is equal to or smaller than 1.7°, a relationship of ts>20 ns is established, the reversal of the magnetization is not ended within the write period of time, that is, a write error is generated.

Although depending on the use application of the ST-MRAM, since values of $10^{-10}$ to $10^{-15}$ are necessary for the write error rate, the probability that a relationship of θ<1.7° is established is not negligible.

For reducing the write error rate, it is effective to increase the current I caused to flow through the MTJ. On the negative side, however, when the current I is increased, other problems such as an increase in consumed current, and isolation breakdown of an element are caused. Therefore, there is a limit to the increase in current.

In the light of the foregoing, in the present disclosure, for the purpose of reducing the write error rate described above, a spin polarizer layer having a magnetization in a direction (a lamination direction or a vertical direction) vertical to a film surface of each of magnetic layers of a memory element is added to the normal MTJ element, thereby composing the memory element.

That is to say, the spin polarizer layer is disposed on a side opposite to the fixed magnetization layer (reference layer) relative to the free magnetization layer (memory layer). In addition, a non-magnetic layer is provided between the spin polarizer layer and the free magnetization layer.

As a result, it is possible to avoid the phenomenon that the spin torque does not function, and even in the case of any of the magnetization angles, it is possible to cause the magnetization reversal within a finite period of time.

2. Embodiment

Subsequently, a concrete embodiment of the present disclosure will be described.

Figure 1:
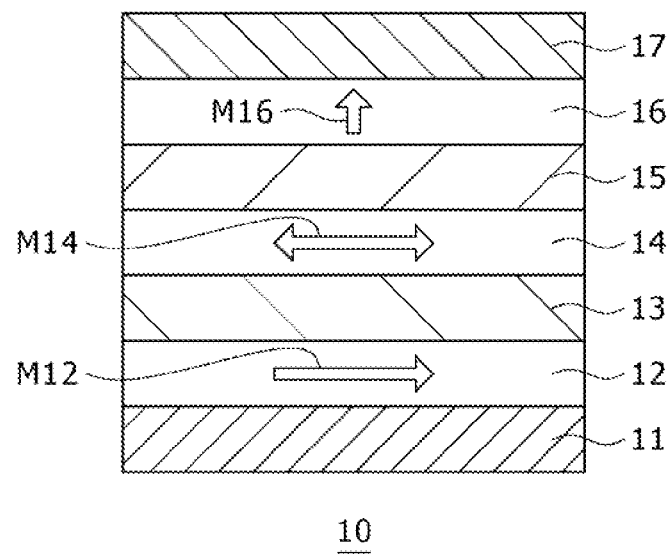
FIG. 1 is a cross sectional view showing a schematic structure of a memory element composing a memory device according to an embodiment of the present disclosure.

FIG. 1 is a cross sectional view showing a schematic structure of a memory element composing a memory device according to an embodiment of the present disclosure.

In the memory element 10 shown in FIG. 1, a fixed magnetization layer (referred to as "a reference layer" as well) 12 whose direction of a magnetization M12 is fixed, a non-magnetic layer (referred to as "an intermediate layer" as well) 13, and a free magnetization layer (memory layer) 14 whose direction of a magnetization M14 is adapted to be reversed are laminated in this order on a base layer 11.

In the fixed magnetization layer 12, the direction of the magnetization M12 is formed to a direction (a rightward direction in the case of FIG. 1) parallel with a film surface of the fixed magnetization layer 12.

The structure of the memory element 10 described above is the same as that of the existing ST-MRAM shown in FIG. 4.

It is noted that although not illustrated, for the purpose of fixing the direction of the magnetization M12 of the fixed magnetization layer 12, an antiferromagnetic layer made of an antiferromagnetic material may be provided between the base layer 11 and the fixed magnetization layer 12.

In addition, unlike the structure of the MTJ of the existing ST-MRAM shown in FIG. 4, in the memory element 10 in this embodiment, the spin polarizer layer 16 described above is provided on the memory layer 14 through the non-magnetic layer 15. A cap layer 17 is laminated on the spin polarizer layer 16.

Unlike other magnetic layers: the fixed magnetization layer 12 and the free magnetization layer 14, a magnetic moment (magnetization) M16 of the spin polarizer layer 16 points to a direction (a lamination direction of each layer or a vertical direction) vertical to a film surface (including a film surface of the spin polarizer layer 16) of each of the layers of the memory element 10.

In addition, in this embodiment, the magnetic moment (magnetization) M16 of the spin polarizer layer 16, as shown in FIG. 1, is fixed upward.

It is noted that in the present disclosure, a structure may also be adapted such that the magnetic moment (magnetization) of the spin polarizer layer 16 is formed downward.

A magnetic material composing a perpendicular magnetization film is used as a material of the spin polarizer layer 16. For example, TePt, CoPt, TbFeCo, GdFeCo, CoPd, MnBi, MnGa, PtMnSb, a Cu—Cr system material, and the like are given as such a material. In addition, it is possible to use a magnetic material, composing the perpendicular magnetization film, other than these materials.

Using the magnetic material composing the perpendicular magnetization film results in that even when the magnetization is not fixed to the vertical direction by using the antiferromagnetic material or the like, the spin polarizer layer 16 can be formed.

It is noted that for making the spin polarizer layer of the magnetic material forming the magnetization in the direction of the film surface without using the magnetic material composing the perpendicular magnetization film, it is necessary to fix the magnetization to the vertical direction by using the antiferromagnetic material or the like. For this reason, in addition to the structure shown in FIG. 1, an antiferromagnetic layer is formed on the spin polarizer layer.

A non-magnetic metal, such as Ru, used between the magnetic layers of the magnetoresistance effect element can be used in the non-magnetic layer 15 between the memory layer 14 and the spin polarizer layer 16.

It is noted that either an insulating material (such as any of various oxides) for composing a tunnel insulating film, or a non-magnetic metal used between the magnetic layers of the magnetoresistance effect element can be used in the non-magnetic layer (intermediate layer) 13 between the fixed magnetization layer 12 and the memory layer 14.

When the insulating material is used as the material of the non-magnetic layer (intermediate layer) 13, as described above, the higher read signal (the change rate of the resistance) can be obtained, and thus the information can be recorded in the memory element by using the lower current.

Various kinds of magnetic materials used in the MTJ of the existing ST-MRAM can be used in the fixed magnetization layer 12 and the memory layer 14.

For example, CoFe can be used in the fixed magnetization layer 12, and CoFeB can be used in the memory layer 14.

In the memory element 10 of this embodiment, the spin polarizer layer 16 is provided on the memory layer 14 through the non-magnetic layer 15. Therefore, as described above, it is possible to avoid the phenomenon that the spin torque does not function. As a result, even in the case of any of the magnetization angles, it is possible to cause the magnetization reversal within a finite period of time.

Here, let us consider a relationship between an angle between magnetizations, and a period of time necessary for the magnetization reversal with respect to the memory element 10 in this embodiment similarly to the case of the MTJ of the existing ST-MRAM shown in FIG. 4.

Let m3 to be a unit vector representing the direction of the magnetization M16 of the spin polarizer layer 16.

A magnitude of the spin torque acting on the magnetization M14 of the memory layer 14 becomes the sum of a spin torque derived from the fixed magnetization layer 12, and a spin torque derived from the spin polarizer layer 16.

That is to say, the magnitude of the spin torque acting on the magnetization M14 of the memory layer 14 is proportional to $A \cdot m1 \times (m1 \times m2) + B \cdot m1 \times (m1 \times m3)$ where a mark "×" is a cross product of vectors, and A and B are constants representing contributing rates of spin torques, respectively.

The magnetization M12 of the fixed magnetization layer 12 is fixed to a direction of an axis of an easy magnetization of the memory layer 14 similarly to the case of the MTJ of the existing ST-MRAM.

When the magnetization M14 of the memory layer 14 points to the axis of the easy magnetization of the memory layer 14 itself, the unit vectors m1 and m2 make an angle of either 0° or 180°. Therefore, the spin torque from the fixed magnetization layer 12 does not function at all.

At this time, however, since the unit vectors m3 and m1 bisect each other at right angles, it is understood that $B \cdot m1 \times (m1 \times m3)$ is not zero and thus the spin torque acts from the spin polarizer layer 16.

As has been described, it is understood that even when the spin torque becomes zero in the existing MTJ, in the memory element in this embodiment, the spin torque acts and the magnetization reversal is promoted.

In the existing MTJ, when the angle between the unit vectors m1 and m2 is θ, the period, ts, of time necessary for the reversal is written in the form of $ts=\tau \ln(\Pi/2\theta)/(I/Ic0-1)$ (refer to Expression (1)).

In the structure of this embodiment in which the three magnetic layers are provided, it may be impossible to obtain such an analytical expression.

Then, for the purpose of examining an effect obtained by providing the spin polarizer layer 16, a computer simulation was carried out.

A time evolution of a magnetization motion was calculated in various magnetization angles by using a so-called microspin model in which there is no spatial distribution of the magnetization. With regard to the constants A and B representing the contributing rates of the negative spin torques, respectively, A was fixed to 1.0, B was changed from −0.8 to 0.8 at 0.2 intervals, and the calculation was carried out for values of respective spin polarizer strengths (B/A). In addition, the magnetization angle was set in the range of −20° to 20°, and the write period of time was set as 20 ns.

Figure 2:
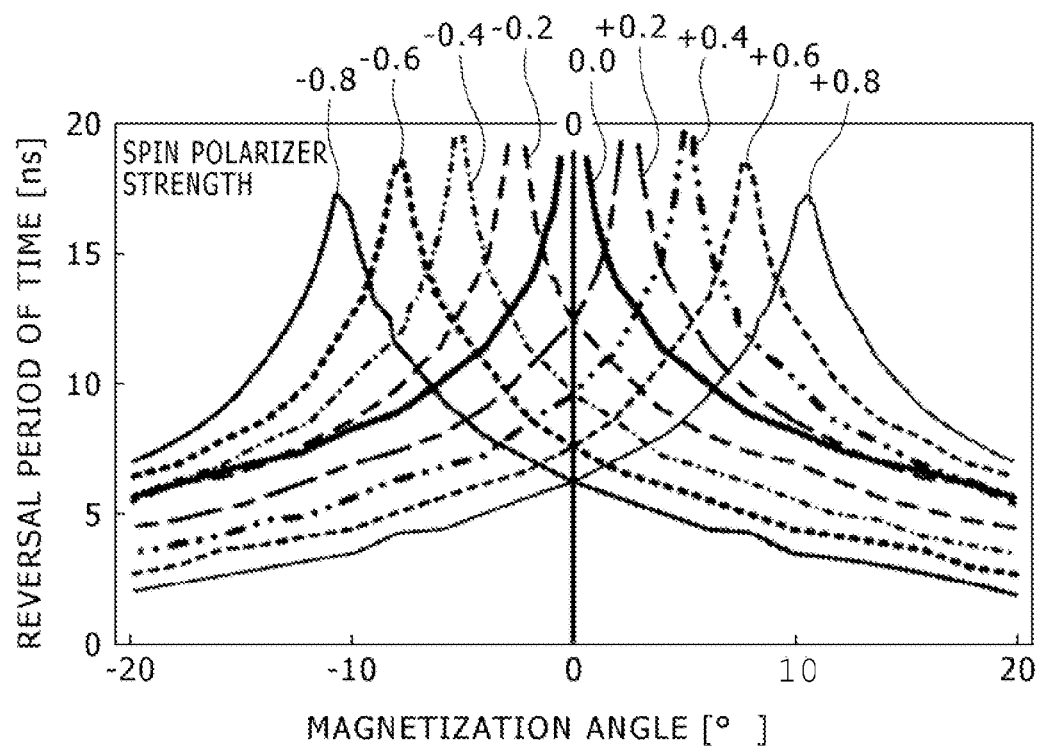
FIG. 2 is a graph representing a relationship between a magnetization angle and a reversal period of time plotted for a spin polarizer strength as a parameter.

A relationship between the magnetization angle and the reversal period of time plotted for the spin polarizer strength is shown as the calculation results in FIG. 2.

In FIG. 2, a graph in which the central spin polarizer strength is zero corresponds to that in the existing MTJ. In this case, it is understood that the graph is interrupted at a point at which the magnetization angle is zero. This represents that the reversal period of time is equal to or larger than 20 ns. When the magnetization angle falls within the interrupted region, the write operation fails to be carried out.

Although the range of the interrupted region is as narrow as about ±2°, since as described above, the values of $10^{-10}$ to $10^{-15}$ are necessary for the write error rate, the narrow range of about ±2° corresponds to a value which is not negligible.

In addition, as the magnetization angle increases from zero, the write period of time monotonously decreases. The reason for this is because a logarithmic portion is a monotonously decreasing function of the magnetization value in Expression (1) for the write period of time: $ts=\tau\ln(\Pi/2\theta)/(I/Ic0-1)$.

Next, the cases where the spin polarizer strengths are ±0.2 and ±0.4, respectively, are checked.

In these cases, even when the magnetization angle is zero, the spin torque functions based on the effect of the spin polarizer layer 16. Therefore, the reversal period of time is as finite as 13 ns when the spin polarizer strength is ±0.2, and is as finite as 10 ns when the spin polarizer strength is ±0.4. Also, it is understood that the reversal period of time has a tendency to become short as the spin polarizer strength is larger.

When the magnetization angle is zero, the most stable state is obtained in which the magnetization M14 of the memory layer 14 points to the axis of the easy magnetization of the memory layer 14 itself.

Although the direction of the magnetization M14 of the memory layer 14 is thermally perturbed, the probability that the magnetization M14 of the memory layer 14 is located in the vicinity of the most stable point is high. For this reason, the fact that the reversal period of time at the magnetization angle of zero becomes short is large in effect in terms of reducing the write error rate.

On the other hand, it is understood that the reversal period of time is increased in a portion in which the magnetization angle is not zero similarly to the case of the existing MTJ. Specifically, the portion in which the magnetization angle is not zero is close to ±2.5° when the spin polarizer strength is ±0.2, and is close to ±5° when the spin polarizer strength is ±0.4. The graphs are interrupted in these points, respectively, which represent that the reversal period of time is equal to or longer than 20 ns. This case can be regarded as the case where the curve of the reversal period of time of the existing MTJ is shifted to right and left. Since the angles at which these reversal periods of time diverge are each located away from the axis of the easy magnetization, the probability that the magnetization is provided in the vicinities of the angles at which these reversal periods of time diverge is smaller than that in the case where the magnetization angle is zero. That is to say, although this case is not as serious as the existing MTJ is concerned, this case can still become an obstacle to attaining of the error rate of $10^{-10}$ to $10^{-15}$.

In addition, the cases where the spin polarizer strengths are ±0.6 and ±0.8, respectively, are checked.

In this case, the reversal period of time in the position where the magnetization angle is zero is 8 ns when the spin polarizer strength is ±0.6, and as smaller as 6 ns when the spin polarizer strength is ±0.8.

In addition, the reversal period of time becomes a peak in the vicinity of the magnetization angle of ±8° when the spin polarizer strength is ±0.6, and becomes a peak in the vicinity of the magnetization angle of ±11° when the spin polarizer strength is ±0.8.

However, a remarkable difference is found out as compared with the case where an absolute value of the spin polarizer strength is equal to or smaller than 0.4. This remarkable difference corresponds to a point that the each of graphs continues without being interrupted. This means that in any of the magnetization angles, the reversal period of time does not become longer than 20 ns. As a result thereof, in the case of the write period of time of 20 ns, the write error is not generated at all.

It is understood that when the suitable spin polarizer strength is fulfilled in the manner as described above, even the write error rate which is as very small as $10^{-10}$ to $10^{-15}$ can be achieved.

Figure 3:
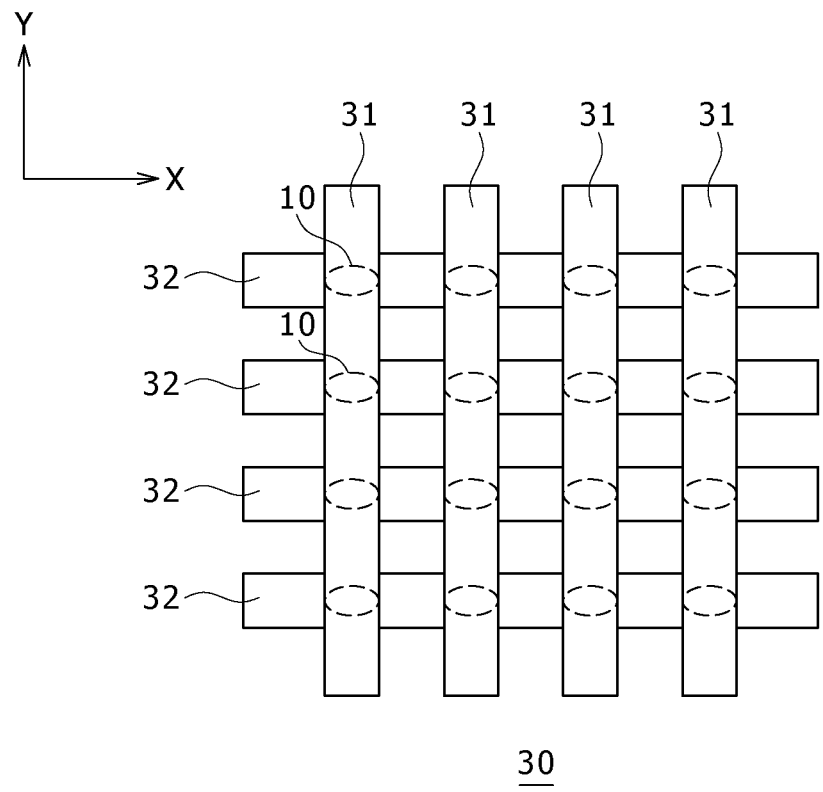
FIG. 3 is a top plan view showing a schematic structure of the memory device according to the embodiment of the present disclosure.

Next, FIG. 3 is a top plan view showing a schematic structure of the memory device, using the memory element 10 shown in FIG. 1, according to this embodiment of the present disclosure.

As shown in FIG. 3, the memory device 30 is structured in such a way that the memory elements 10 are disposed in intersections between a large number of first wiring (for example, bit lines) 31 and a large number of second wirings (for example, word lines) 32, respectively. In this case, a large number of first wiring 31 and a large number of second wirings 32 are disposed so as to bisect each other at right angles.

The memory element 10 has an ellipsoidal shape as a planar shape, and also has the cross sectional structure shown in FIG. 1.

In addition, the memory element 10, as shown in FIG. 1, has the fixed magnetization layer 12, the memory layer (free magnetization layer) 14, and the spin polarizer layer 16.

Also, memory cells of the memory device 30 are composed of the memory elements 10, respectively.

Although not illustrated, the first wiring 31 and the second wiring 32 are electrically connected to corresponding one of the memory elements 10 and a current can be caused to flow through the corresponding one of the memory elements 10 in the direction of the lamination of the layers (in the vertical direction) of the corresponding one of the memory elements 10.

Also, the current is caused to flow through the corresponding one of the memory elements 10 to reverse the direction of the polarization of the memory layer 14, thereby making it possible to record information in the memory element. Specifically, similarly to the case of the existing ST-MRAM, the polarity of the current (the direction of the current) caused to flow through the memory element 10 is changed to reverse the direction of the magnetization of the memory layer 14, thereby recording the information in the memory element.

According to this embodiment, in each of the memory elements 10 composing the memory cells of the memory device 30, the spin polarizer layer 16 having the upward magnetization M16 is provided on the side opposite to the fixed magnetization layer (reference layer) 12 relative to the memory layer 14 through the non-magnetic layer 15.

The direction of the magnetization M16 of the spin polarizer 16 is upward and is vertical to the direction, of the magnetization M14 of the memory layer 14, as an in-plane direction of the memory layer 14. Therefore, the direction of the magnetization M14 of the memory layer 14 can be moved from the direction of the axis of the easy magnetization of the memory layer 14.

As a result, it is possible to avoid the phenomenon that the spin torque for the magnetization M14 of the memory layer 14 does not function.

That is to say, even when the angle between the direction of the magnetization M14 of the memory layer 14, and the direction of the magnetization M12 of the fixed magnetization layer 12 is 0°, 180° or an angle close thereto, the direction of the magnetization M14 of the memory layer 14 is reversed within the predetermined finite period of time, thereby making it possible to record the information in the memory element.

Therefore, according to this embodiment of the present disclosure, since the direction of the magnetization of the memory layer is reversed within the predetermined period of time, thereby making it possible to record the information in the memory element, the write error can be reduced and the write operation can be carried out for the shorter period of time.

Since the write error can be reduced, the reliability of the write operation can be enhanced.

In addition, since the write operation can be carried out for the shorter period of time, the speed-up of the operation can be realized.

That is to say, it is possible to realize the memory device which has the high reliability in the write operation and which operates at the high speed.

In this embodiment described above, the free magnetization layer (memory layer) 14 and the fixed magnetization layer (reference layer) 12 are formed from the single magnetic layers.

In the present disclosure, at least one of the free magnetization layer 14 and the fixed magnetization layer 12 may also be formed from plural magnetic layers. For example, a structure may also be adopted such that plural magnetic layers which are different in composition from one another are directly laminated, or plural magnetic layers are laminated on one another through non-magnetic layer(s) to be antiferromagnetically coupled to one another.

In addition, the fixed magnetization layer (reference layer) 12, the non-magnetic layer 13, the free magnetic layer (memory layer) 14, the non-magnetic layer 15, and the spin polarizer layer 16 are disposed from the lower layer side. In the present disclosure, however, it is also possible to adopt a structure that these layers 12 to 16 are disposed upside down.

When as with this embodiment described above, the fixed magnetic layer (reference layer) 12 is disposed on the lower layer side, the relatively thick layers such as an antiferromagnetic layer (not shown) are disposed on the lower layer side. Therefore, there is obtained an advantage that the etching for patterning of the memory element can be readily carried out as compared with the case of the structure that the fixed magnetic layer 12 is disposed on the upper layer side.

The present disclosure is by no means limited to the embodiment described above, and various constitutions can be adopted without departing from the subject matter of the present disclosure.

The present disclosure contains subject matter related to that disclosed in Japanese Priority Patent Application JP 2010-136163 filed in the Japan Patent Office on Jun. 15, 2010, the entire content of which is hereby incorporated by reference.

What is claimed is:

1. A memory device, comprising:
   (a) a memory element including
      (i) a base layer on a lower side of the memory element,
      (ii) a fixed magnetization layer over the base layer, the fixed magnetization layer having a fixed direction of magnetization that is parallel with a film surface of the fixed magnetization layer,
      (iii) a memory layer over the fixed magnetization layer, the memory layer provided to hold therein information in accordance with a magnetization state of a magnetic material,
      (iii) a first non-magnetic layer between the fixed magnetization layer and the memory layer,
      (iv) a magnetic layer over the memory layer, the magnetic layer having a direction of magnetization that is perpendicular to the film surface of the fixed magnetization layer,
      (v) a second non-magnetic layer between the magnetic layer and the memory layer, and
      (vi) an antiferromagnetic layer on the magnetic layer; and
   (b) a wiring through which a current is caused to flow through the memory element.

2. The memory device according to claim 1, wherein the magnetic layer whose direction of the magnetization is perpendicular to the film surface of the fixed magnetization layer is made of a material composing a perpendicular magnetization film.

3. The memory device according to claim 1, wherein the first non-magnetic layer between the fixed magnetization layer and the memory layer is an insulating layer.

4. The memory device according to claim 1, wherein at least one of the fixed magnetization layer and the memory layer includes multiple layers.

5. The memory device according to claim 1, further comprising a cap layer on an upper side of the memory layer over the magnetic layer.

* * * * *